United States Patent
Ramappa et al.

(10) Patent No.: US 9,924,303 B2
(45) Date of Patent: Mar. 20, 2018

(54) DEVICE AND METHOD FOR IMPLEMENTING SYNCHRONOUS CONNECTION-ORIENTED (SCO) PASS-THROUGH LINKS

(71) Applicant: AVAGO TECHNOLOGIES GENERAL IP (SINGAPORE) PTE. LTD., Singapore (SG)

(72) Inventors: Raghavendra Ramappa, Bangalore (IN); Mudumba Ananth, Sullurupeta (IN); Ravi Nagarajan, Bangalore (IN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/214,720

(22) Filed: Jul. 20, 2016

(65) Prior Publication Data
US 2018/0020318 A1   Jan. 18, 2018

Related U.S. Application Data
(60) Provisional application No. 62/362,426, filed on Jul. 14, 2016.

(51) Int. Cl.
| | |
|---|---|
| *H04W 4/00* | (2009.01) |
| *H04M 7/00* | (2006.01) |
| *H04M 1/725* | (2006.01) |
| *H03M 3/02* | (2006.01) |
| *H04W 84/12* | (2009.01) |

(52) U.S. Cl.
CPC .......... *H04W 4/008* (2013.01); *H03M 3/024* (2013.01); *H04M 1/7253* (2013.01); *H04M 7/0072* (2013.01); *H04M 2201/30* (2013.01); *H04W 84/12* (2013.01)

(58) Field of Classification Search
CPC ... H04W 4/008; H04W 84/12; H04M 1/7253; H04M 7/0072; H04M 2201/30; H03M 3/024
See application file for complete search history.

(56) References Cited

U.S. PATENT DOCUMENTS

| | | | |
|---|---|---|---|
| 8,848,676 B1 * | 9/2014 | Wheeler | H04B 7/0602 370/311 |
| 2006/0194538 A1 * | 8/2006 | Palin | H04L 1/1887 455/41.2 |
| 2010/0130129 A1 * | 5/2010 | Chang | H04W 28/06 455/41.2 |
| 2010/0273417 A1 * | 10/2010 | Tian | H04M 1/6066 455/41.2 |
| 2013/0331032 A1 * | 12/2013 | Kumar | H04M 1/7253 455/41.2 |

* cited by examiner

*Primary Examiner* — Lewis West
(74) *Attorney, Agent, or Firm* — Oblon, McClelland, Maier & Neustadt, L.L.P.

(57) ABSTRACT

An electronic device includes circuitry configured to determine that a first codec associated with a signal corresponds to one of one or more codecs supported by another device that is connected to the electronic device via a first communication link. A signal path is configured between a radio device configured to receive the signal and the electronic device based on a correspondence between the first codec associated with the signal and the one or more codecs supported by the another device. The signal is transmitted to the other device via the first communication link encoded with one of the one or more codecs supported by the other device.

19 Claims, 6 Drawing Sheets

DEVICE AND METHOD FOR IMPLEMENTING SYNCHRONOUS CONNECTION-ORIENTED (SCO) PASS-THROUGH LINKS

CROSS-REFERENCE TO RELATED PATENT APPLICATIONS

The present application claims the benefit of the earlier filing date of U.S. provisional application 62/362,426 having common inventorship with the present application and filed in the U.S. Patent and Trademark Office on Jul. 14, 2016, the entire contents of which being incorporated herein by reference.

BACKGROUND

Technical Field

The present disclosure is directed to communication links between Bluetooth-enabled devices, specifically synchronous connection-oriented (SCO) links.

Description of the Related Art

Synchronous connection-oriented (SCO) links or enhanced SCO links are Bluetooth (BT) communication links that are used to send and receive voice data between BT-enabled electronic devices such as cell phones and BT-enabled headsets or car kits. The BT special interest group (SIG) has defined the continuously variable slope delta modulation (CVSD) codec and modified sub-band coding (mSBC) codec as the default codecs for voice signals transmitted through the SCO or eSCO links. For example, the CVSD codec is used to encode narrowband voice signals, and the mSBC codec is used to encode wideband voice signals.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
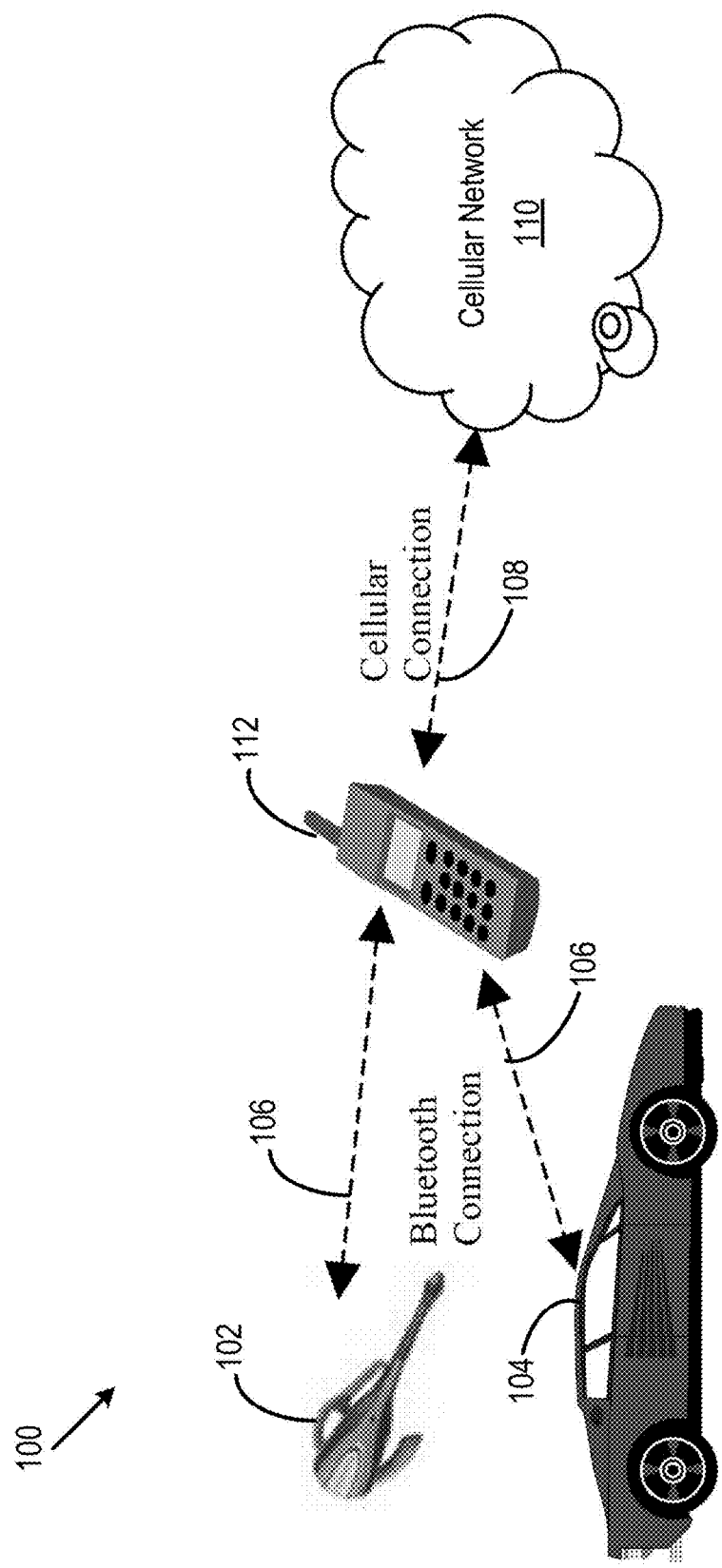
FIG. 1 is an exemplary diagram of a Bluetooth (BT) communication system.

In the drawings, like reference numerals designate identical or corresponding parts throughout the several views. Further, as used herein, the words "a," "an" and the like generally carry a meaning of "one or more," unless stated otherwise.

In an exemplary implementation, an electronic device includes circuitry configured to determine that a first codec associated with a signal corresponds to one of one or more codecs supported by another device that is connected to the electronic device via a first communication link. A signal path is configured between a radio device configured to receive the signal and the electronic device based on a correspondence between the first codec associated with the signal and the one or more codecs supported by the other device. The signal is transmitted to the other device via the first communication link encoded with one of the one or more codecs supported by the other device.

In another exemplary implementation, a process includes determining, via an electronic device with circuitry, that a first codec associated with a signal corresponds to one of one or more codecs supported by another device that is connected to the electronic device via a communication link; configuring, via the circuitry, a signal path between a radio device configured to receive the signal and the electronic device for a pass-through mode based on a correspondence between the first codec associated with the signal and the one or more codecs supported by the other device; and transmitting, via the circuitry, the signal to the other device via the communication link encoded with one of the one or more codecs supported by the other device.

In another exemplary implementation, a Bluetooth (BT) radio includes a controller with circuitry configured to determine that a first codec associated with a signal corresponds to one of one or more codecs supported by another device that is connected to the electronic device via a synchronous connection-oriented (SCO) communication link, configure a radio device configured to receive the signal for a SCO pass-through mode based on a correspondence between the first codec associated with the signal and the one or more codecs supported by the other device, and transmit the signal to the other device via the communication link encoded with one of the one or more codecs supported by the other device.

Aspects of the present disclosure are directed to a system, device, and method for implementing a synchronous connection-oriented (SCO) or enhanced SCO (eSCO) pass-through link for voice signals transmitted between Bluetooth (BT)-enabled devices that include a lower data rate and a greater amount of time between data transmissions than conventional SCO implementations without sacrificing data quality. In some implementations, the SCO pass-through link is implemented when a received cellular signal is encoded with a codec that is supported by a BT headset or hands-free (HF) terminal connected to a BT device such as a mobile device. When the SCO pass-through link is implemented, a BT radio in the mobile device can configure a communication path between the BT radio and a cellular radio that receives the cellular signal to bypass a digital signal processor (DSP) of the cellular radio so that BT radio can transmit the cellular signal to the BT headset without having to perform additional processing. The reduced data rate associated with the SCO pass-through link results in a reduced rate of power consumption for the mobile device. Also, in implementations where the BT radio shares an antenna with another radio, such as a wireless local area network (WLAN) radio, the increased about of time between data transmissions with the SCO pass-through link provides increases an amount of time that can be allocated to transmitting or receiving signals at the other radio. Throughout the disclosure, references to SCO links can refer to either SCO or eSCO links.

FIG. 1 is an exemplary diagram of a BT communication system 100, according to one example. The BT communication system 100 includes a BT-enabled electronic device such as mobile device 112 that is an audio gateway for both input and output audio signals. The mobile device 112 is connected to at least one cellular network 110 via cellular connection 108 and is configured to transmit and receive voice signals, data signals, etc. For example, the cellular network 110 can be a 2G, 3G, 4G, Global System for Mobile communication (GSM), Universal Mobile Telecommunications System (UMTS), Long Term Evolution (LTE), Code Division Multiple Access (CDMA) or any other type of cellular network. The mobile device 112 can also be connected to other types of wireless communication networks, such as WI-FI networks or any other type of wireless network that is known.

In some implementations, the mobile device 112 can connect to one or more hands-free (HF) terminals such as a headset 102 or BT car kit 104 via a BT connection 106, which can include a SCO link. The HF terminals are devices that function as remote audio input and output mechanisms for the audio gateway, which is the mobile device 112 in the communication system 100. In addition, the HF terminals can include other types of devices that can provide audio input and/or output functionality for the mobile device, such as headphones or speakers. References to the HF terminal, headset 102, and car kit 104 throughout the disclosure can be used interchangeably. In one example, a cellular radio in the mobile device 112 can receive a voice signal via the cellular connection 108 from the cellular network 110, a BT radio can transmit the voice signal via the BT SCO link to the headset 102 or car kit 104, and the voice signal is output from the headset 102 or car kit 104 via a speaker.

In some implementations, the BT radio in the mobile device 112 includes a BT controller with processing circuitry configured to process signals received from the cellular radio into a format compatible with the HF terminal, such as the headset 102 or car kit 104. In some examples, the received signal is decoded at the cellular radio into a raw pulse-code modulation (PCM) format which is transmitted to the BT radio, and the BT radio encodes the PCM signal with a codec supported by the headset 102 or the car kit 104. For example, narrowband signals may be encoded with a continuously variable slope delta modulation (CVSD) codec and wideband signals may be encoded with a modified sub-band coding (mSBC) codec, and the encoded signals are transmitted to the headset 102 or car kit 104 via the BT connection 106, which may be the SCO link. Throughout the disclosure, references to supported codecs refer to types of codecs that a particular device, such as the HF terminal or mobile device 112, are able to encode and/or decode from a signal.

The BT controller in the mobile device 112 may also be configured to control a format of the signal transmitted from the cellular radio to the BT radio based on a correspondence between the codec associated with a wireless protocol of the received signal and one or more codecs supported by the HF terminal. For example, when the BT connection 106 between the HF terminal and the mobile device 112 is established, the mobile device 112 and HF terminal exchange configuration parameters, which can include a list of codecs supported by the HF terminal. The processing circuitry of the BT controller in the mobile device 112 can determine the codecs supported by the HF terminal based on the exchanged configuration parameters. The BT controller of the mobile device 112 can also determine the wireless protocol associated with the signals received by the cellular radio. For example, a LTE signal is encoded with an adaptive multi-rate audio (AMR) codec, a GSM signal is encoded with a g.711 codec, and a CDMA signal is encoded with an enhanced variable rate codec (EVRC).

If the codec associated with the received cellular signal corresponds to a codec supported by the headset 102 or car kit 104, the BT controller can output a control signal to configure a signal path between the cellular radio and the BT radio so that a digital signal processor (DSP) of the cellular radio is bypassed and the received signal is not decoded at the cellular radio into a PCM format. The encoded cellular signal is transmitted to the BT radio of the mobile device 112, which is then transmitted by the BT radio to the HF terminal via the SCO link. For example, if the BT controller determines that a connected HF terminal supports the AMR codec, and a received cellular signal is a LTE signal encoded with the AMR codec, then the cellular radio transmits the encoded LTE signal to the BT radio, which in turn transmits the encoded LTE signal to the HF terminal via the SCO link without modifying a signal format. Transmitting the received cellular signal to the HF terminal over the SCO link without de-coding the signal at the cellular radio and re-encoding the signal at the BT radio can be referred to as a SCO pass-through link or SCO pass-through mode. Details regarding the SCO pass-through link are discussed further herein.

Figure 2:
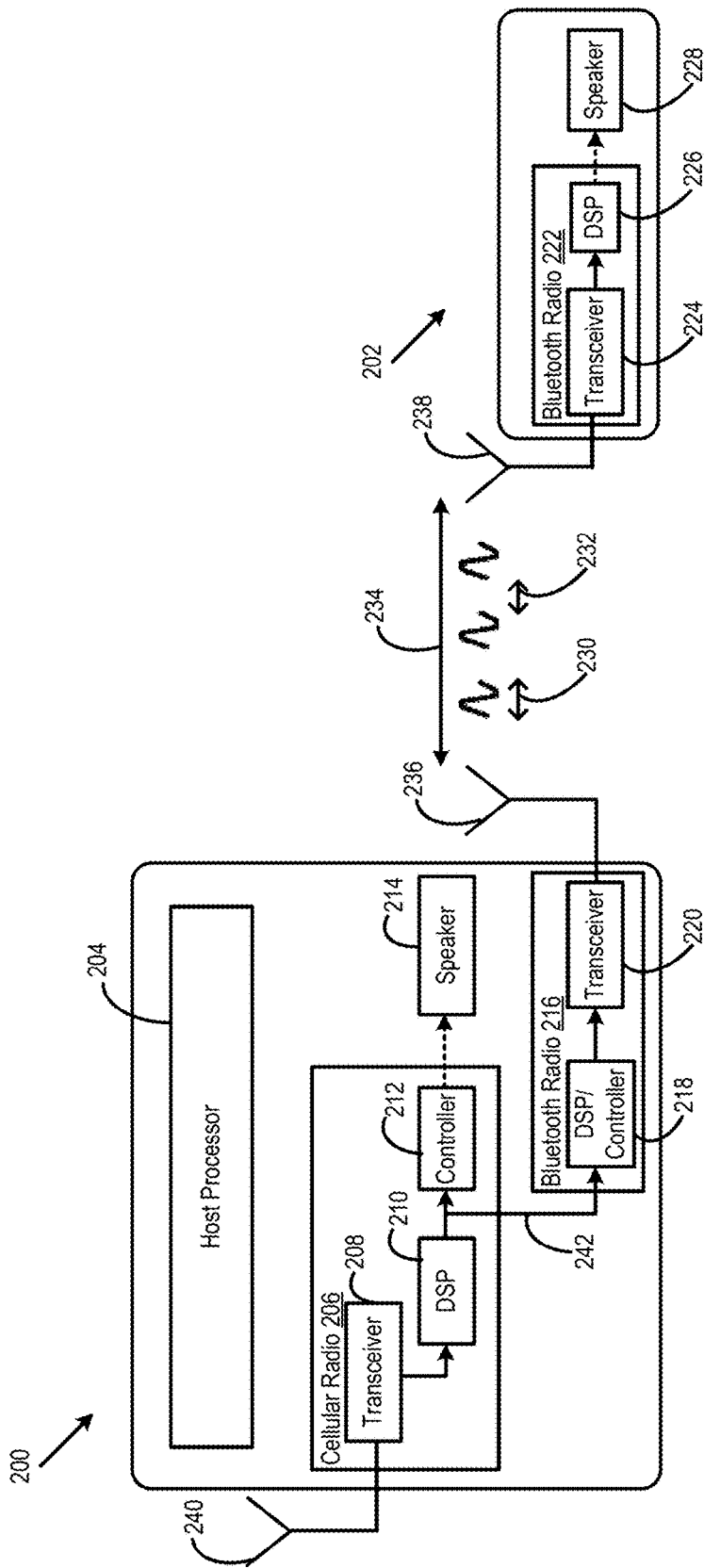
FIG. 2 is an exemplary block diagram of a BT-enabled device and a hands-free (HF) terminal.

FIG. 2 is an exemplary block diagram of a BT-enabled electronic device 200 and HF terminal 202, according to one example. The electronic device 200 can be any type of device configured with a BT radio that is able to transmit and/or receive BT signals, such as the mobile device 112. The electronic device 200 can also include additional blocks and circuitry than those described herein. The electronic device 200 includes a host processor 204 that manages the control and execution of software processes associated with one or radios of the electronic device 200 and can manage operation and interactions between the radios. For example, the host processor 204 can determine a wireless protocol associated with a signal received at cellular radio 206 and can inform BT radio of the wireless protocol and associated codec of the received signal.

The cellular radio 206 includes a transceiver 208 with associated circuitry to transmit and/or receive wireless signals from at least one antenna 240 and a digital signal processor (DSP) 210 that includes circuitry to decode and process the received signal into a predetermined format, such as a PCM format. If a BT connection is not established between the BT radio 216 and HF terminal 202, a cellular radio controller 212 sends the received signal to be output by speaker 214. If a BT SCO link 234 is established between the BT radio 216 and BT radio 222 of the HF terminal 202, the decoded PCM signal is transmitted to the BT radio 216 via communication path 242.

The BT radio 216 includes a DSP/controller 218 that includes one or more processors and associated circuitry configured to encode the received PCM signal with a predetermined codec, and transceiver 220 transmits the encoded signal via antenna 236 to the BT radio 222 of the HF terminal 202 via the BT SCO link 234. For example, narrowband signals that transmitted via the BT SCO link 234 may be encoded with the CVSD codec, and wideband signals may be encoded with the mSBC codec. The PCM signals have a larger data size than encoded signals, so processing the PCM signals into encoded signals for transmission can cause excessive drain of the battery of the electronic device 200. In some implementations, data transmissions encoded with the CVSD or mSBC codecs that are transmitted through the BT SCO link 234 have a frame length 230 of 60 bytes, a data rate of 64 kilobits per second (Kbps), and an amount of time between data transmissions 232 of 7.5 milliseconds (ms).

In addition, the BT signals transmitted from the BT radio 216 of the electronic device 200 to the BT radio 222 of the HF terminal 202 are received at transceiver 224 via antenna 238, decoded at DSP 226, and output by speaker 228.

Figure 3:
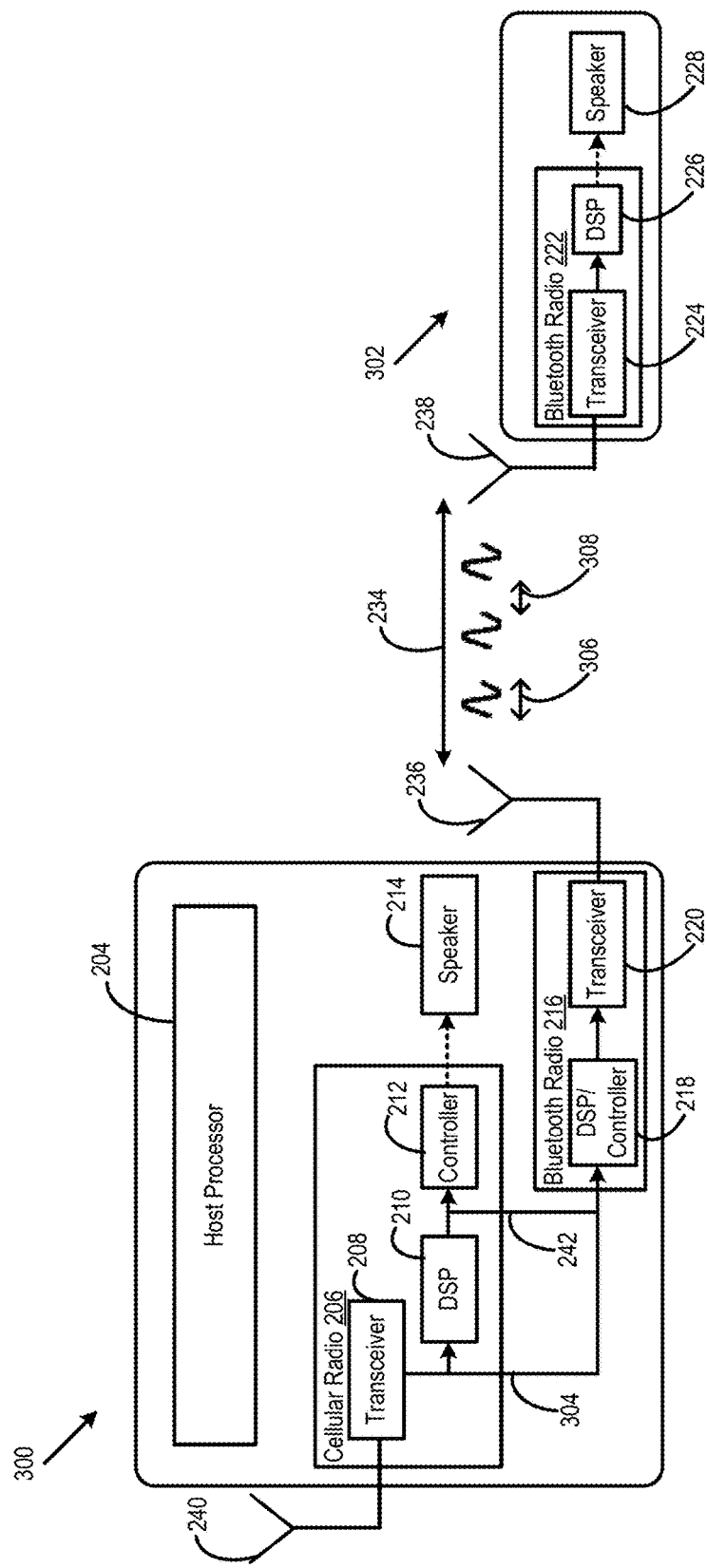
FIG. 3 is an exemplary block diagram of a BT-enabled device and a HF terminal.

FIG. 3 is an exemplary block diagram of a BT-enabled electronic device 300 and HF terminal 302, according to one example. Like the electronic device 200, the electronic device 300 can also be any type of device configured with a BT radio that is able to transmit and/or receive BT signals, such as the mobile device 112. The electronic device 300 includes the same components described with respect to the electronic device 200 but also includes an additional signal path 304 between the cellular radio 206 and BT radio 216 that bypasses the DSP 210 of the cellular radio 206. In some implementations, the processing circuitry of the DSP/controller 218 can output a control signal to configure the signal path 304 between the cellular radio 206 and the BT radio 216 when the cellular signal received at the transceiver 208 is encoded with a codec supported by the BT radio 222 of the HF terminal 302 connected to the BT radio 216 of the electronic device 200 via the BT SCO link 234.

In some implementations, when the BT SCO connection 234 between the BT radio 222 of the HF terminal 302 and the BT radio 216 mobile device 300 is established, the mobile device 300 and HF terminal 302 exchange configuration parameters via configuration messages, which can include a list of codecs supported by the BT radio 222 of the HF terminal 302. The processing circuitry of the DSP/controller 218 in the BT radio 216 can determine the codecs supported by the BT radio 222 of the HF terminal 302 based on the exchanged configuration parameters. In addition, the DSP/controller 218 can determine the codec associated with the cellular signal received at the transceiver 208 based on a wireless protocol of the received signal. For example, if the cellular signal is a LTE signal, then the associated codec is the AMR codec.

The DSP/controller 218 can determine the codec associated with the received cellular signal based on data received from the host processor 204. For example, the DSP/controller 218 can output a codec interrogation message to the host processor 204, which returns a message to the DSP/controller 204 that includes the wireless protocol and/or codec associated with the received cellular signal. If the DSP/controller 218 determines that BT radio 222 of the HF terminal 302 supports the codec associated with the received cellular signal, such as the AMR codec in the case of the LTE signal, then the DSP/controller 218 can output the control signal to implement the SCO pass-through link, which includes configuring the signal path 304 between the cellular radio 206 and the BT radio 216. The signal path 304 bypasses the DSP 210 so that the BT radio 216 receives the cellular signal encoded with the codec, and the DSP/controller 218 does not have to perform any additional processing to encode the signal prior to transmission via the BT SCO link 234. For example, in the case of the LTE signal, the BT radio 216 receives the cellular signal encoded with the AMR codec, and the transceiver 220 transmits the AMR-encoded signal to the BT radio 222 of the HF terminal 302 via the BT SCO link 234. Also, the processing circuitry of the DSP/controller 218 can be configured to transmit the encoded signal to the BT radio 222 of the HF terminal 302 via the BT SCO link 234 encoded independent of one or more codecs supported by the BT radio 216. For example, if the cellular signal is the LTE signal and the BT radio 222 of the HF terminal 302 supports the AMR codec, but the BT radio 216 of the mobile device 300 does not support the AMR codec, the processing circuitry DSP/controller 218 of the BT radio 216 can be configured to configure the signal path 304 and transmit the encoded signal to the HF terminal 302 to be decoded by the DSP 226 of the BT radio 222.

When the signal path 304 bypassing the DSP 210 is configured to implement the SCO pass-through link, properties of the data transmissions can be based on the codec associated with the received cellular signal. For example, when the received cellular signal is a LTE signal encoded with the AMR codec, SCO pass-through transmissions transmitted through the BT SCO link 234 have a frame length 306 of 72 bytes, a data rate of approximately 30 Kbps, and an amount of time between data transmissions 308 of 20 ms. The SCO pass-through link with the signal path 304 allows for a reduced data rate and increased amount of time between transmissions as compared to the data transmissions associated with the signal path 242. Also, bypassing the DSP 210 of the cellular radio 206 reduces a total number of processing cycles for the DSP 210, which results in a reduction in power consumption by the mobile device 300, preserving battery life. In addition to this, the signal path 304 also provides for a reduction in end-to-end time latency because the received signal is not processed by the DSP 210 of the cellular radio. Table 1 illustrates timing information associated with various codecs, such as the CVSD, mSBC, and narrowband and wideband AMR codecs. As can be seen in Table 1, the AMR codec associated with the signal path 304 bypassing the DSP 210 provides a reduced data rate and an increased amount of time between data transmissions as compared with the CVSD and mSBC codecs associated with the signal path 242.

TABLE 1

| Codec | Time between transmissions (ms) | Data size/frame length (bytes) | Data rate (Kbps) |
| --- | --- | --- | --- |
| CVSD (Narrowband) | 7.5 | 60 | 64 |
| mSBC (Wideband) | 7.5 | 60 | 64 |
| AMR (Narrowband) | 20 | 42 | 16.8 |
| AMR (Wideband) | 20 | 72 | 28.85 |

In some implementations, the increased amount of time between data transmissions when the SCO pass-through link is implemented provides an increased amount of time that the BT radio 216 can sleep between transmissions, which can contribute to the reduction in power consumption. The DSP/controller 218 can output control signals to initiate sleep cycles for the BT radio 216 that correspond to the amounts of time between data transmissions. In addition, the processing circuitry of the DSP/controller 218 can also be configured to combine multiple data packets into a single data transmission, which can further increase the amount of time between data transmissions. For example, if two AMR data packets are combined into a single data transmission that is transmitted across the BT SCO link 234, the amount of time between data transmission when the BT radio 216 can sleep is approximately 40 ms. Table 2 provides exemplary timing information for two AMR-encoded data packets that are combined into a single data transmission.

TABLE 2

| Codec | Time between transmissions (ms) | Data size/frame length (bytes) | Data rate (Kbps) |
| --- | --- | --- | --- |
| AMR (Narrowband) | 40 | 72 | 14.5 |
| AMR (Wideband) | 40 | 132 | 26.4 |

In some examples, the BT radio 216 may share the antenna 236 with another radio in the electronic device 300, such as a wireless local area network (WLAN) radio that can establish a WLAN communication link with other devices, such as a WLAN access point. The processing circuitry of the DSP/controller 218 can be configured to allocate the amount of time between data transmissions to WLAN communications. The increased amount of time between data transmissions provided by the SCO pass-through link implementations allows a greater amount of time to be allocated to the WLAN communications.

If the DSP/controller 218 determines that the BT radio 222 of the HF terminal 302 does not support the codec associated with the received cellular signal, then the DSP/controller 218 can output a control signal to configure the signal path 242 through the DSP 210, and the BT radio 216 receives the cellular signal in the raw PCM format, and the DSP/controller 218 encodes the received PCM signal with a codec supported by the BT radio 222 of the HF terminal 302, such as the CVSD codec or the mSBC codec, and the transceiver 220 outputs the encoded signal to the HF terminal 302 via the BT SCO link 234.

Figure 4:
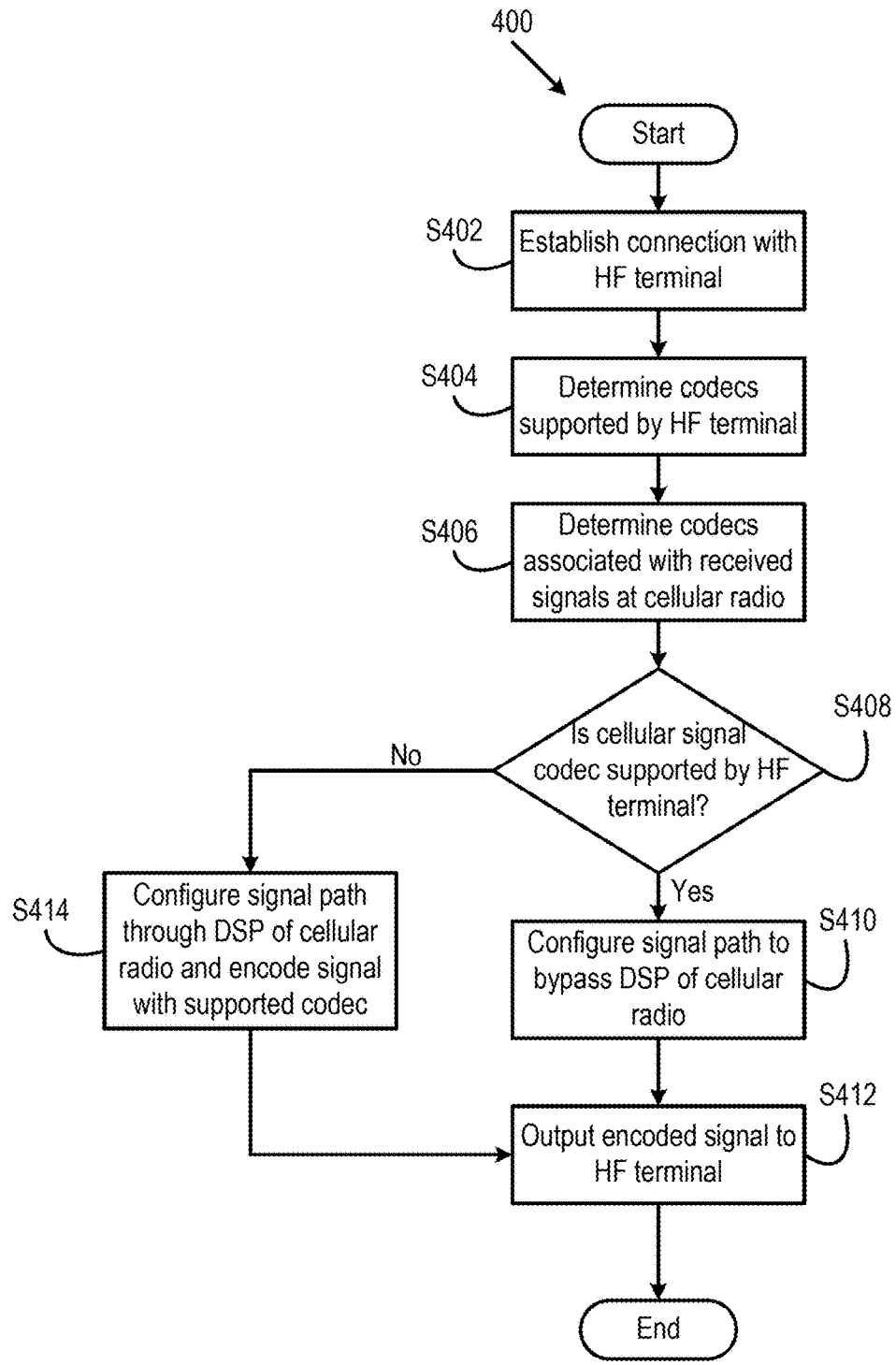
FIG. 4 is an exemplary flowchart of a process for implementing a synchronous connection-oriented (SCO) pass-through link, according to certain embodiments.

FIG. 4 is an exemplary flowchart of a process 400 for implementing a synchronous connection-oriented (SCO) pass-through link, according to certain embodiments. The process 400 is described with respect to the BT radio 216 of the electronic device 300 and the BT radio 222 of the HF terminal 302 that are connected through the BT SCO link 234 but can also be applied to other types of BT-enabled devices that are able to communicate via SCO links.

At step S402, the BT radio 216 of the electronic device establishes the BT SCO link 234 with the BT radio 222 of the HF terminal 302 via predetermined BT protocol messages. In some implementations, when the BT SCO connection 234 between the BT radio 222 of the HF terminal 302 and the BT radio 216 mobile device 300 is established, the mobile device 300 and HF terminal 302 exchange configuration parameters via configuration messages, which can include a list of codecs supported by the BT radio 222 of the HF terminal 302.

At step S404, the processing circuitry of the DSP/controller 218 in the BT radio 216 can determine the codecs supported by the BT radio 222 of the HF terminal 302 based on the exchanged configuration parameters. In addition, the DSP/controller 218 can determine the codec associated with the cellular signal received at the transceiver 208 based on a wireless protocol of the received signal. For example, if the cellular signal is a LTE signal, then the associated codec is the AMR codec.

At step S406, the DSP/controller 218 can determine the codec associated with the received cellular signal based on data received from the host processor 204. For example, the DSP/controller 218 can output a codec interrogation message to the host processor 204, which returns a message to the DSP/controller 204 that includes the wireless protocol and/or codec associated with the received cellular signal.

At step S408, the processing circuitry of the DSP/controller 218 determines whether the codec associated with the received cellular signal corresponds to one of the codecs supported by the BT radio 222 of the HF terminal 302. If the codec associated with the received cellular signal corresponds to one of the codecs supported by the BT radio 222 of the HF terminal 302, resulting in a "yes" at step S408, then step S410 is performed. Otherwise, if the codec associated with the received cellular signal does not correspond to one of the codecs supported by the BT radio 222 of the HF terminal 302, resulting in a "no" at step S408, then step S414 is performed.

If the DSP/controller 218 determines at step S408 that BT radio 222 of the HF terminal 302 supports the codec associated with the received cellular signal, such as the AMR codec in the case of the LTE signal, then at step S410, the DSP/controller 218 can output the control signal to implement the SCO pass-through link, which includes configuring the signal path 304 between the cellular radio 206 and the BT radio 216. The signal path 304 bypasses the DSP 210 so that the BT radio 216 receives the cellular signal encoded with the codec, and the DSP/controller 218 does not have to perform any additional processing to encode the signal prior to transmission via the BT SCO link 234.

If the DSP/controller 218 determines at step S408 that BT radio 222 of the HF terminal 302 does not support the codec associated with the received cellular signal, then at step S414, the DSP/controller 218 can output the control signal to configure the signal path 242 between the cellular radio 206 and the BT radio 216. The BT radio 216 receives the cellular signal in the raw PCM format, and the DSP/controller 218 encodes the received PCM signal with a codec supported by the BT radio 222 of the HF terminal 302, such as the CVSD codec for narrowband signals or the mSBC codec for wideband signals, and the transceiver 220 outputs the encoded signal to the HF terminal 302 via the BT SCO link 234.

At step S412, the transceiver 220 of the BT radio 216 outputs the encoded signal to the BT radio 222 of the HF terminal 302 via the BT SCO link 234. If the fIF terminal 302 supports the codec associated with the received cellular signal and the SCO pass-through link is implemented at step S140, then the transmitted signal remains encoded with the same codec as the received cellular signal. For example, in the case of the LTE signal, the BT radio 216 receives the cellular signal encoded with the AMR codec, and the transceiver 216 transmits the AMR-encoded signal to the BT radio 222 of the HF terminal 302 via the BT SCO link 234. If the HF terminal 302 does not support the codec associated with the received cellular signal, then the transmitted signal may be encoded with the CVSD or mSBC codec. The BT signals transmitted from the BT radio 216 of the electronic device 230 to the BT radio 222 of the HF terminal 302 are received at the transceiver 224 via the antenna 238, decoded at the DSP 226, and output by the speaker 228.

Figure 5:
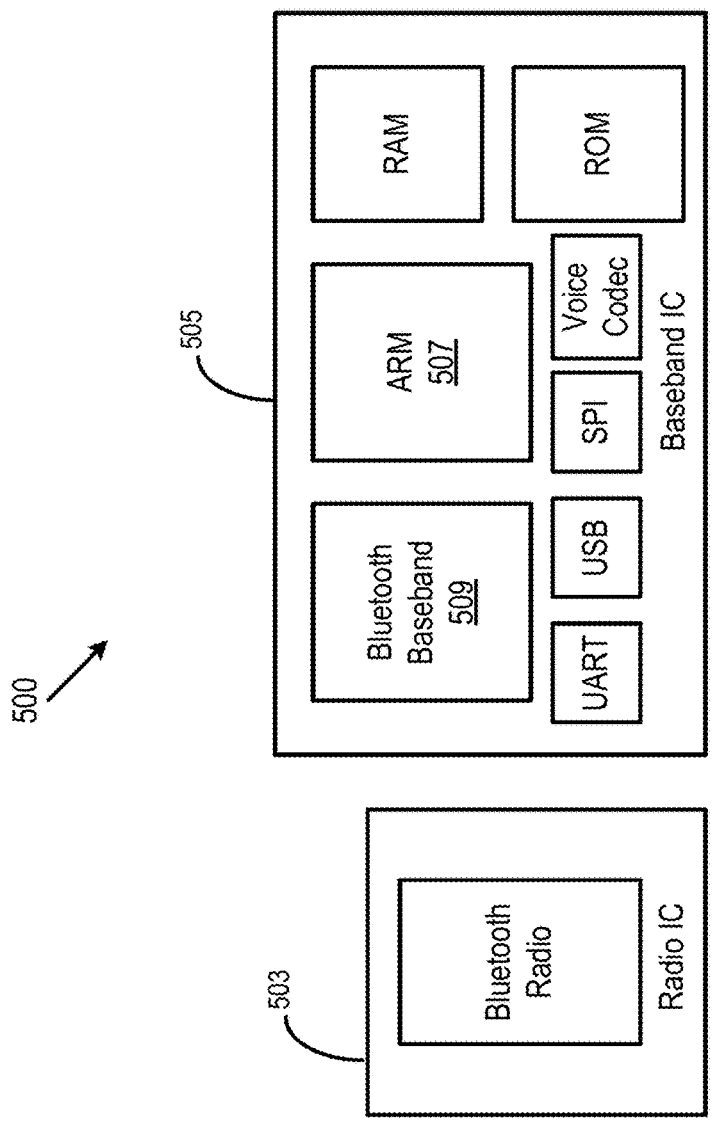
FIG. 5 is an exemplary hardware block diagram of a BT radio.

FIG. 5 is an exemplary hardware block diagram of a BT radio 500, according to some implementations, such as the BT radio 216 of the mobile device 112 or the BT radio 222. BT hardware implementations are typically highly integrated systems including of one or more chips. The block diagram of the BT radio 500 illustrates an exemplary BT hardware implementation, which includes a Radio IC 503 and a Baseband IC 505.

The Bluetooth baseband chip includes a processor core such as an ARM7 with integrated memories 507, Bluetooth baseband 509, and several other peripherals. The radio can be implemented in a separate chip 503. The ARM7 processor runs all the required software including a lower stack, an upper stack, and an embedded profile, which provides for a small, low power, low cost solution.

Figure 6:
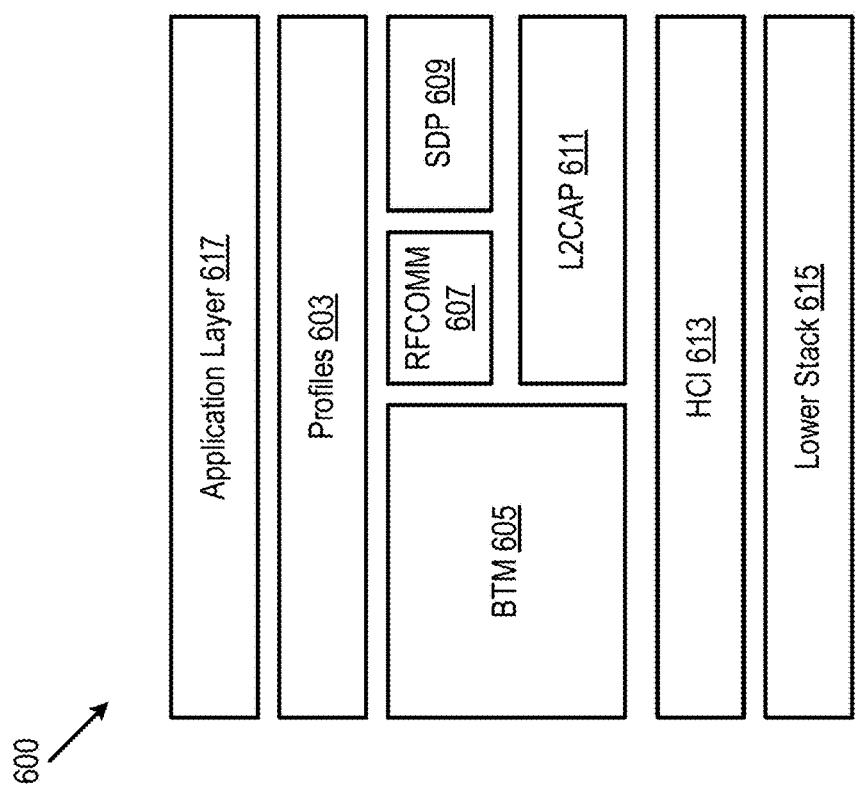
FIG. 6 is an exemplary block diagram of a BT protocol stack.

FIG. 6 is a simplified exemplary block diagram of a BT protocol stack 600 on which on which the examples described herein can be implemented. The protocol stack includes one or more software processes associated with implementing data transfer and other features associated with radio applications. The protocol stack includes several different protocols designed for different purposes. The profiles, or applications, reside above the protocol stack. BT also has a lower protocol stack for link management and baseband control. The stack 600 includes Profiles 603, a BTM 605, Radio Frequency Communication (RFCOMM) 607, Service Discovery Protocol (SDP) 609, Logical Link Control and Adaptation Protocol (L2CAP) 611, Host Controller Interface (HCI) 613, and Lower Stack 615. In some implementations, the software processes associated with implementation the SCO link and the SCO pass-through link are associated with the lower stack 615. An application layer 617 includes the software instructions that implement various tools that take advantage of the Bluetooth functionality.

Aspects of the present disclosure are directed to reducing a processing burden on a DSP of a cellular radio of a BT-enabled electronic device by bypassing the DSP of the cellular radio when the codec associated with a received cellular signal is supported by a BT radio of a HF terminal connected to the electronic device via a BT SCO link. Implementing the SCO pass-through link preserves battery life of the electronic device by reducing a number of processing cycles for the DSP of the cellular radio and increasing an amount of time that the BT radio can sleep between data transmissions. In addition, the increased amount of time between data transmissions allows more time to be allocated to data transmissions associated with another radio that shares an antenna with the BT radio. Also, the data rate of the SCO data transmissions can be reduced without reducing signal quality.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components. Additionally, an implementation may be performed on modules or hardware not identical to those described. Accordingly, other implementations are within the scope that may be claimed.

The invention claimed is:

1. An electronic device comprising:
   circuitry configured to
      determine whether a first codec associated with a signal corresponds to one of one or more codecs supported by another device that is connected to the electronic device via a first communication link;
      configure a signal path between a radio device configured to receive the signal and the electronic device to bypass a digital signal processor (DSP) of the radio device in a case that the first codec associated with the signal corresponds to the one or more codecs supported by the another device; and
      transmit the signal to the another device via the first communication link.

2. The device of claim 1, wherein the first communication link connecting the device to the another device is a Bluetooth communication link.

3. The device of claim 1, wherein the received signal is a voice signal and the first communication link is a Bluetooth synchronous connection-oriented (SCO) link or a Bluetooth enhanced SCO (eSCO) link.

4. The device of claim 1, wherein the circuitry is further configured to identify the one or more codecs supported by the another device based on a configuration message received from the another device.

5. The device of claim 1, wherein the first codec corresponds to a wireless signal protocol associated with the radio device.

6. The device of claim 1, wherein the circuitry is further configured to receive the signal encoded according to the first codec.

7. The device of claim 6, wherein the circuitry is further configured to transmit the signal to the another device encoded according to the first codec.

8. The device of claim 7, wherein the first codec is an adaptive multi-rate audio (AMR) codec, a g.711 codec, or an enhanced variable rate codec (EVRC).

9. The device of claim 1, wherein the circuitry is further configured to transmit the signal to the another device at a first data rate that is less than a second data rate associated with a second signal path between the radio device and the electronic device that includes the DSP of the radio device.

10. The device of claim 1, wherein the circuitry is further configured to transmit the signal with a first amount of time between data transmissions that is greater than a second amount of time between data transmissions associated with a second signal path between the radio device and the electronic device that includes the DSP of the radio device.

11. The device of claim 10, wherein the circuitry is further configured to allocate the first amount of time between data transmissions to communications between the electronic device and one or more additional electronic devices via a second communication link.

12. The device of claim 11, wherein the second communication link is a wireless local area network (WLAN) communication link.

13. The device of claim 1, wherein the circuitry is further configured to configure a second signal path between the radio device and the electronic device through a DSP of the radio device in a case that the first codec associated with the received signal does not correspond to one of the one or more codecs supported by the another device.

14. The device of claim 13, wherein the circuitry is further configured to receive the signal in a pulse-code modulation (PCM) format in the case that the signal path corresponds to the second signal path.

15. The device of claim 14, wherein the circuitry is further configured to encode the signal with a codec supported by the another device.

16. The device of claim 15, wherein the codec is a continuously variable slope delta modulation (CVSD) codec or a modified sub-band coding (MSEC) codec.

17. The device of claim 1, wherein the circuitry is further configured to transmit the signal to the another device via the first communication link encoded with a codec that is independent of one or more codecs supported by the electronic device.

18. A method comprising:
   determining, via an electronic device with circuitry, whether a first codec associated with a signal corresponds to one of one or more codecs supported by another device that is connected to the electronic device via a communication link;

configuring, via the circuitry, a signal path between a radio device configured to receive the signal and the electronic device for a pass-through mode to bypass a digital signal processor (DSP) of the radio device in a case that the first codec associated with the signal corresponds to the one or more codecs supported by the another device; and transmitting, via the circuitry, the signal to the another device via the communication link.

19. A wireless communication device comprising:

a wireless interface configured to receive a signal encoded according to a first codec; and circuitry configured to determine whether the first codec corresponds to one or more codecs supported by another device that is connected to the electronic device via a communication link;

configure a signal path between the wireless interface and the another electronic device to bypass a digital signal processor (DSP) of the wireless communication device in a case that the first codec corresponds to the one or more codecs supported by the another device; and transmit the signal to the another device via the communication link.

* * * * *